(12) United States Patent
Fukuoka et al.

(10) Patent No.: US 7,335,578 B2
(45) Date of Patent: Feb. 26, 2008

(54) METHOD FOR MANUFACTURING SEMICONDUCTOR CHIP

(75) Inventors: Masateru Fukuoka, Osaka (JP); Munehiro Hatai, Osaka (JP); Satoshi Hayashi, Osaka (JP); Yasuhiko Oyama, Osaka (JP); Shigeru Danjo, Osaka (JP); Masahiko Kitamura, Tokyo (JP); Koichi Yajima, Tokyo (JP)

(73) Assignees: Sekisui Chemical Co., Ltd., Osaka (JP); Disco Corporation, Tokyo (JP)

( * ) Notice: Subject to any disclaimer, the term of this patent is extended or adjusted under 35 U.S.C. 154(b) by 209 days.

(21) Appl. No.: 10/490,557

(22) PCT Filed: Apr. 9, 2003

(86) PCT No.: PCT/JP03/04472

§ 371 (c)(1),
(2), (4) Date: Mar. 23, 2004

(87) PCT Pub. No.: WO03/085714

PCT Pub. Date: Oct. 16, 2003

(65) Prior Publication Data
US 2004/0259332 A1 Dec. 23, 2004

(30) Foreign Application Priority Data
Apr. 11, 2002 (JP) ............... 2002-109178

(51) Int. Cl.
*H01L 21/00* (2006.01)

(52) U.S. Cl. ............ 438/464; 438/460; 438/462; 438/977; 257/E21.599

(58) Field of Classification Search ............ 438/460, 438/462, 464, 977
See application file for complete search history.

(56) References Cited

U.S. PATENT DOCUMENTS

| | | | | |
|---|---|---|---|---|
| 5,923,995 A | * | 7/1999 | Kao et al. | 438/460 |
| 6,425,971 B1 | * | 7/2002 | Silverbrook | 156/230 |
| 6,759,121 B2 | * | 7/2004 | Alahapperuma et al. | 428/355 AC |
| 6,862,080 B2 | * | 3/2005 | Matsui | 355/72 |
| 2002/0004288 A1 | * | 1/2002 | Nishiyama | 438/464 |

FOREIGN PATENT DOCUMENTS

| | | |
|---|---|---|
| JP | 7-142623 | 6/1995 |
| JP | 2000-40677 | 2/2000 |
| JP | 2001-200234 | 7/2001 |

* cited by examiner

*Primary Examiner*—Zandra V. Smith
*Assistant Examiner*—Christy L Novacek
(74) *Attorney, Agent, or Firm*—Wenderoth, Lind & Ponack, L.L.P.

(57) ABSTRACT

A semiconductor wafer (W) where circuits are formed in the area divided by streets is split into semiconductor chips having individual circuits. By interposing an adhesive sheet, whose adhesive force is lowered by stimulation, between the semiconductor wafer (W) and the support plate (13), the front side of the semiconductor wafer (W) is adhered to the support plate (13), thereby exposing the rear face (10) of the semiconductor wafer (W). The rear face (10) of the semiconductor wafer (W) with the support plate (13) is ground. After the grinding is finished, the semiconductor wafer (W) held with the rear face (10) up is diced into semiconductor chips (C). The adhesive sheet is given stimulus to lower the adhesive force and the semiconductor chips (C) are removed from the support plate (13). The semiconductor wafer and semiconductor chips are always supported by the support plate, avoiding damage and deformation.

16 Claims, 7 Drawing Sheets

METHOD FOR MANUFACTURING SEMICONDUCTOR CHIP

TECHNICAL FIELD

The present invention relates to a method for manufacturing semiconductor chips in which, in the course of a rear face of a semiconductor wafer being ground followed by dicing to obtain semiconductor chips, the semiconductor wafer and semiconductor chips are inhibited from being damaged and deformed.

BACKGROUND ART

Semiconductor chips such as ICs and LSIs are formed in such a way that after a rear face of a semiconductor wafer W in which in each of a number of regions C divided by streets S as shown in FIG. 14 a circuit is formed is ground to a desired thickness, the semiconductor wafer is diced vertically and horizontally along the streets S.

When the rear face is ground, a front face side is held by a grinding machine; accordingly, in order to protect circuits formed on the front face, ordinarily a protective tape is stuck to the front face. Furthermore, when in order to make various kinds of electronic instruments smaller and thinner, a semiconductor wafer W is ground to a thickness as thin as for instance 100 μm or less, the ground semiconductor wafer W becomes soft like paper and difficult to handle. In order to make transport and so on thereafter easier, the front face of the semiconductor wafer W is stuck to a rigid support plate to support the semiconductor wafer W; that is, a device for making the transport and so on easier is applied.

However, when the semiconductor wafer thinned by the grinding of the rear face is diced by use of a dicing machine, the semiconductor wafer has to be peeled off from the support plate and to be stuck to a dicing tape; accordingly, in peeling or sticking, the semiconductor wafer is likely to be damaged. Particularly, in a semiconductor wafer of which thickness is made extremely thin such as 100 μm or less, or 50 μm or less by grinding, it is extremely difficult to reattach it without causing damage.

Furthermore, in an invention disclosed in, for instance, JP-A 10-284449, the grinding and dicing are performed with a front face of a semiconductor wafer stuck to a holding tape, and accordingly, there is no need of reattaching when switching from grinding to dicing; however, when the semiconductor chips are peeled off from the dicing tape after the dicing, the semiconductor chips are likely to be damaged such as by cracking or breaking, deformation and so on.

In this connection, the present invention intends to inhibit the semiconductor wafer and semiconductor chips from being damaged, deformed and so on when a semiconductor wafer is ground and the semiconductor wafer is diced to manufacture semiconductor chips.

SUMMARY OF INVENTION

The present invention provides a method for manufacturing semiconductor chips which is a dividing method in which a semiconductor wafer on which a circuit is formed in each of regions divided by streets is divided into semiconductor chips for individual circuits, the method including steps of: integrating a support plate by sticking a front face of a semiconductor wafer to the support plate with an adhesive sheet of which adherence decreases owing to stimulation intervened therebetween and with a rear face of the semiconductor wafer exposed; grinding a rear face of the semiconductor wafer that is integrated with the support plate; dicing the semiconductor wafer that was ground and is integrated with the support plate with the rear face directed upward into semiconductor chips; and applying stimulation to the adhesive sheet to lower the adherence and separating the semiconductor chips from the support plate.

The method for manufacturing semiconductor chips additionally includes conditions such as: that a gas-generating agent that generates a gas according to the stimulation is contained in the adhesive sheet; the stimulation is UV light and the gas-generating agent generates a gas due to UV light; in the separating step, only a semiconductor chip that is wanted to be separated from the support plate is irradiated by UV light; an adhesive sheet is formed by providing a gas-generating agent made of an azo compound in at least one or more kinds of resins selected from acrylic resins, olefinic resins and polycarbonate base resins; the support plate is made of a transparent or translucent material; the support plate is made of glass and has a thickness from 0.5 to 2.5 mm; and an outer periphery of the support plate is provided with alignment marks that indicate positions of streets.

According to the method for manufacturing semiconductor chips thus configured, the semiconductor wafer is stuck to a support plate having high rigidity through an adhesive sheet of which adherence decreases according to the stimulation. In this state, the grinding and dicing are applied, and thereafter the stimulation is applied to lower the adherence. In this manner, a semiconductor chip is picked up, accordingly, in these steps or during transport between these steps, the semiconductor wafer or the semiconductor chips can always be stably supported, the semiconductor chips can be safely and assuredly picked up, and the semiconductor chips do not undergo damage such as cracking, breaking and the like, and deformation and the like.

DETAILED DESCRIPTION OF THE INVENTION

As the best mode for carrying out the present invention, a method for manufacturing individual semiconductor chips C by grinding a rear face of a semiconductor wafer W shown in FIG. 1 and dicing streets S vertically and horizontally will be explained.

Figure 1:
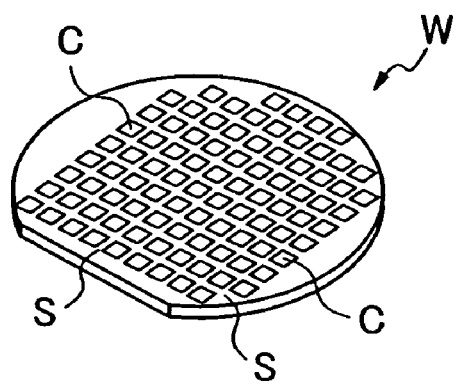
FIG. 1 is a perspective view showing a semiconductor wafer to which the present invention is applied.
Figure 2:
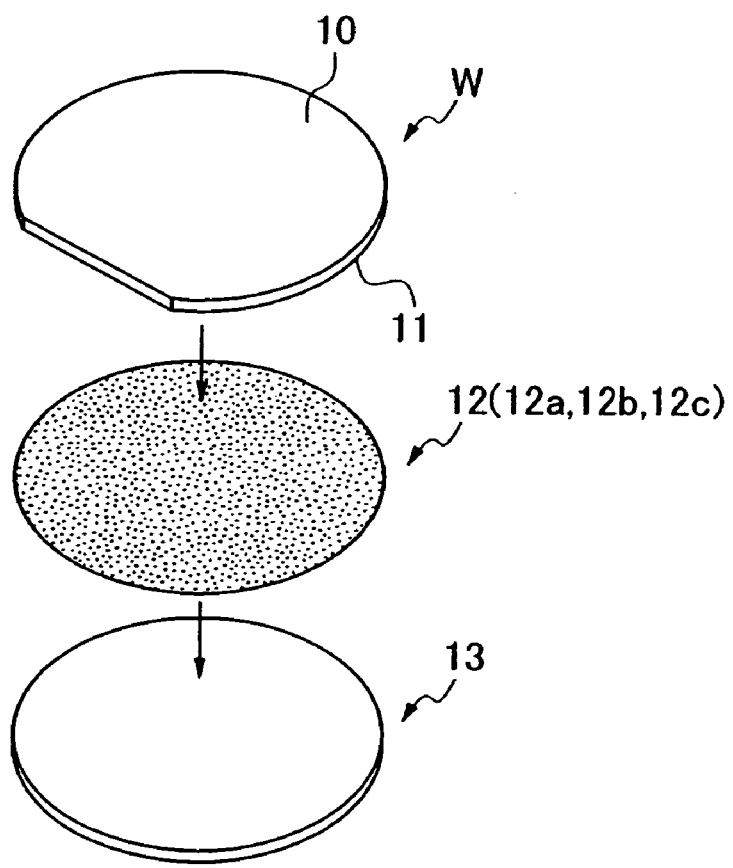
FIG. 2 is a perspective view showing a step of integrating a support plate that constitutes the invention.
Figure 3:
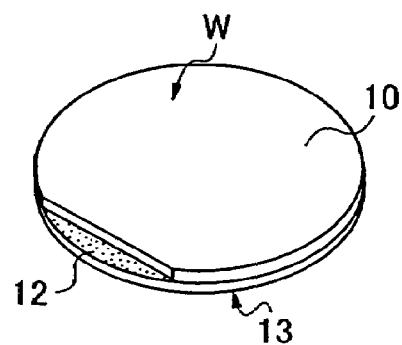
FIG. 3 is a perspective view showing a state in which the semiconductor wafer and the support plate are integrated.

In a semiconductor wafer W shown in FIG. 1, a circuit is formed on a front face of each of plural regions divided by streets S. As shown in FIG. 2, in a state where the semiconductor wafer W is turned upside down to direct a rear face 10 upward, the front face of the semiconductor wafer W is stuck, through an adhesive sheet 12, to a support plate 13 to integrate the wafer W and support plate 13 as shown in FIG. 3 (step of integrating a support plate). That is, the front face 11 of the semiconductor wafer W is stuck to the adhesive sheet 12.

The adhesive sheet 12 has the characteristic that its adherence decreases upon stimulation. For instance, it may include a gas-generating agent that lowers the adherence due to the release of a gas from a surface. In this case, as the stimulation, for instance, UV light is used.

Figure 4:
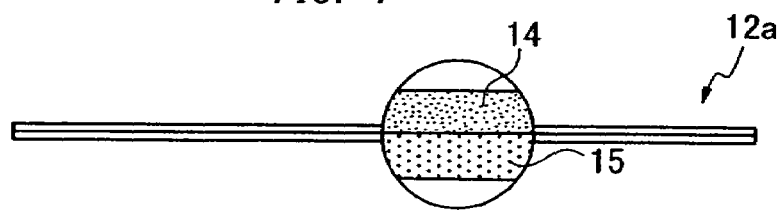
FIG. 4 is a partly enlarged sectional view showing part of a first example of an adhesive sheet.
Figure 5:
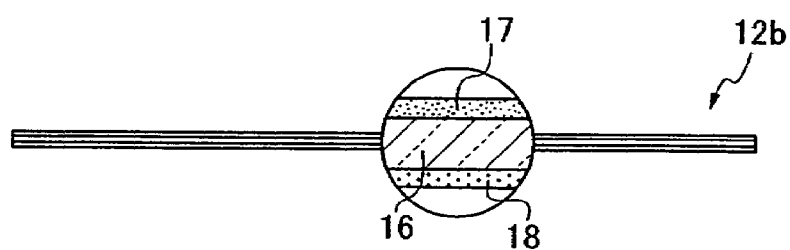
FIG. 5 is a partly enlarged sectional view showing part of a second example of an adhesive sheet.
Figure 6:
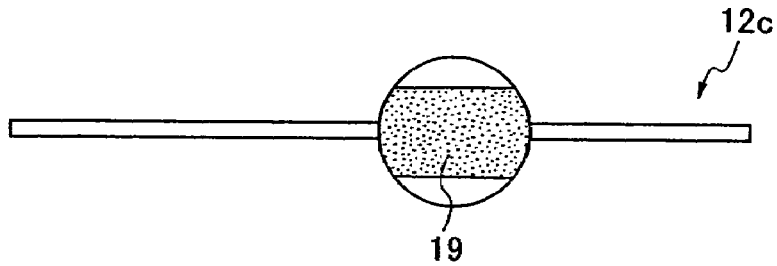
FIG. 6 is a partly enlarged sectional view showing part of a third example of an adhesive sheet.

The adhesive sheet 12 may be an adhesive and non-support tape that has adhesive layers 14 and 15 on both faces like an adhesive sheet 12a shown in FIG. 4, or a type in which adhesive layers 17 and 18 are formed on both faces of a base material 16 like an adhesive sheet 12b shown in FIG. 5. Furthermore, like an adhesive sheet 12c shown in FIG. 6, it may be an unsupported tape made of only a single adhesive layer 19.

In the case of a type of adhesive sheet where the base material 16 is used, such as the adhesive sheet 12b shown in FIG. 5, if the adhesive layer 17 is one for which adherence decreases due to light, the base material 16 is preferably one that transmits light or allows light to pass through; for instance, sheets made of transparent resins such as acryl, olefin, polycarbonate, vinyl chloride, ABS, polyethylene terephthalate (PET), nylon, urethane, polyimide and so on, sheets having a network structure, sheets in which holes are opened and so on can be used.

The adhesive layers 14, 17 and 19 that constitute the adhesive sheets 12a, 12b and 12c contain a gas-generating agent that generates a gas due to the stimulation. As the stimulation, light, heat, ultrasound and so on can be used; among these, light or heat can be preferably used. Furthermore, as the light, UV light, visible light and so on can be used.

As the gas-generating agent, there are no particular restrictions; however, for instance, azo compounds and azide compounds can be preferably used. The azo compounds include such as 2,2'-azobis-(N-butyl-2-methylpropion-amide), 2,2'-azobis{2-methyl-N-[1,1-bis(hydroxymethyl)-2-hydroxyethyl]propionamide}, 2,2'-azobis{2-methyl-N-[2-(1-hydroxybutyl)]propionamide}, 2,2'-azobis[2-methyl-N-(2-hydroxyethyl)propionamide], 2,2'-azobis[N-(2-propenyl)-2-methylpropionamide], 2,2'-azobis(N-butyl-2-methyl-propionamide), 2,2'-azobis(N-cyclohexyl-2-methylpropionamide), 2,2'-azobis[2-(5-methyl-2-imidazoline-2-yl)propane]dihydrochloride, 2,2'-azobis[2-(2-imidazoline-2-yl)propane]dihydrochloride, 2,2'-azobis[2-(2-imidazoline-2-yl) propane]disulfate-dihydrate, 2,2'-azobis[2-(3,4,5,6-tetrahydropyrimidine-2-yl)propane] dihydro-chloride, 2,2'-azobis{2-[1-(2-hydroxyethyl)-2-imidazoline-2-yl]propane}dihydro-chloride, 2,2'-azobis[2-(2-imidazoline-2-yl)propane], 2,2'-azobis(2-methyl-propionamydine)hydrochloride, 2,2'-azobis(2-aminopropane)dihydrochloride, 2,2'-azobis[N-(2-carboxyacyl)-2-methyl-propionamidine], 2,2'-azobis{2-[N-(2-carboxyethyl)amidine]propane}, 2,2'-azobis(2-methylpropionamideoxime), dimethyl 2,2'-azobis(2-methylpropionate), dimethyl 2,2'-azobisisobutylate, 4,4'-azobis(4-cyanocarbonic acid), 4,4'-azobis(4-cyanopentanoic acid), 2, 2'-azobis(2,4,4-trimethylpentane) and so on. Among the steps for manufacturing a semiconductor wafer, there are steps where the wafer is exposed to high temperatures. For instance, in the step of grinding the rear face of the semiconductor wafer, a high temperature is caused owing to the frictional heat; accordingly, among these, 2,2'-azobis-(N-butyl-2-methyl-propionamide), 2,2'-azobis(N-butyl-2-methylpropionamide) and 2,2'-azobis(N-cyclohexyl-2-methylpropionamide) that are high in the thermal decomposition temperature are preferable. These azo compounds generate a nitrogen gas by the stimulation due to light, heat and so on.

Furthermore, as the azide compounds, polymers having an azide group such as 3-azidemethyl-3-methyloxetane, terephthal azide, p-tert-butylbenzazide, and glycidil azide polymers that are obtained by ring-opening polymerization of 3-azidemethyl-3-methyloxetane can be used. These azide compounds generate a nitrogen gas by the stimulation due to light, heat and impact.

Among these gas-generating agents, the azide compounds are problematic because these compounds, even when impact is applied, easily decompose and release a nitrogen gas, and thus, the handling is difficult. Furthermore, the azide compounds, when the decomposition once starts, induce a chain reaction and explosively release a nitrogen gas and, as such, cannot be controlled; accordingly, there is another problem in that, in some cases, the semiconductor wafer is damaged due to the explosively generated nitrogen gas. From these problems, an amount of the azide compound to use is limited.

On the other hand, the azo compounds, different from the azide compounds, do not generate a gas due to the impact; accordingly, the azo compounds are extremely easy to handle. Furthermore, it is most unlikely for the azo compounds to cause a chain reaction and explosively generate a gas; accordingly, the semiconductor wafer will not be damaged. In addition, since when light irradiation is interrupted, the gas generation can be also interrupted, the azo compounds also have an advantage in that the adhesiveness can be controlled in accordance with the applications. Accordingly, the azo compounds can be more preferably used as the gas-generating agent.

When the gas-generating agent as mentioned above is contained in the adhesive layer 14, 17 or 19, the stimulation applied to the adhesive layer 14, 17 or 19 causes the gas-generating agent to generate a gas and thereby lower the adherence, resulting in easily peeling the semiconductor chips afterward.

The gas-generating agent may be dispersed in the adhesive layer 14, 17 or 19; however, in that case, since the whole adhesive layer becomes an air bubble generating body, the adhesive layer becomes excessively soft, and there is a likelihood that the adhesive layer cannot be well peeled. Accordingly, the gas-generating agent is preferably contained only in a surface layer portion that is in contact with semiconductor wafer W. When the gas-generating agent is contained in the surface layer portion, a contact area between the adhesive sheet and the semiconductor chip is reduced due to the gas generated from the gas-generating agent, and in addition the gas at least partially peels the adhesive surface of the adhesive layer off the semiconductor chip and thereby lowers the adherence.

As the method of allowing the gas-generating agent to be contained only in a surface layer portion of the adhesive layer 14, 17 or 19, for instance, a method can be used in which an adhesive containing a gas-generating agent is coated on the adhesive layer in a thickness substantially from 1 to 20 μm, or a method can be used in which a volatile liquid containing a gas-generating agent is coated or sprayed on a surface of a previously prepared adhesive layer 14, 17 or 19 to uniformly stick the gas-generating agent to the surface of the adhesive layer, and so on.

In the case of the gas-generating agent being stuck to the surface of the adhesive layer, it is preferred to use a gas-generating agent that has excellent compatibility with the adhesive. That is, when the gas-generating agent is much stuck onto the surface of the adhesive layer, the adherence is deteriorated; however, when the adhesive and the gas-generating agent are compatible, the adherence does not decrease since adhered gas-generating agent is absorbed by the adhesive.

Although a thickness of the surface layer portion depends on a thickness of the adhesive layer, it is preferable to have a thickness of up to 20 μm from the surface of the adhesive. Furthermore, the surface portion here contains a mode where the gas-generating agent uniformly adheres to the surface of the adhesive and a mode where the gas-generating agent stuck to the surface of the adhesive dissolves compatibly with the adhesive to be absorbed by the adhesive layer.

The adhesive constituting the adhesive layers 14, 17 and 19 is preferably one for which the elastic modulus rises due to the stimulation. In this case, the stimulation to raise the elastic modulus may be the same as that to generate a gas from the gas-generating agent or may be different therefrom. The adhesive can be, for instance, a photo-curing adhesive containing an acrylic acid alkyl ester base and/or methacrylic acid alkyl ester base polymerizing polymer having a radical polymerizing unsaturated bond in a molecule and a radical polymerizing polyfunctional oligomer or monomer as a primary component, and a polymerization initiator as the need arises; or a thermo-setting adhesive containing an acrylic acid alkyl ester base and/or methacrylic acid alkyl ester base polymerizing polymer that has a radical polymerizing unsaturated bond in a molecule and a radical polymerizing polyfunctional oligomer or monomer as primary component, and a thermal polymerization initiator.

In the curing type adhesives such as the photo-curing adhesive or the thermosetting adhesive as mentioned above, the whole adhesive layer is uniformly and rapidly polymerized and cross-linked to integrate due to irradiation of light or application of heat, and accordingly, the rise of the elastic modulus due to the polymerization and hardening becomes remarkable, resulting in a large decrease in the adherence. Furthermore, when a gas is generated from the gas-generating agent in a hard cured substance, most of the generated gas is released outside, and the released gas at least partially peels an adhesion surface between the semiconductor chip and the adhesive layer to result in lowering of the adhesive force.

The polymerizing polymer can be obtained, for instance, by previously synthesizing a (meth)acrylic polymer having a functional group in a molecule (hereinafter referred to as "functional group-containing (meth)acrylic polymer") and by allowing this to react with a compound having a functional group that reacts with the above functional group and a radical polymerizing unsaturated bond in a molecule (hereinafter referred to as "functional group-containing unsaturated compound"). In the present specification, the (meth)acryl means acryl or methacryl.

The functional group-containing (meth)acrylic polymer, as a polymer that is adhesive at room temperature, similarly to the case of general (meth)acrylic polymers, can be obtained by copolymerizing, according to an ordinary method, an acrylic acid alkyl ester and/or methacrylic acid alkyl ester in which an alkyl group usually has from 2 to 18 carbon atoms as a primary monomer, a functional group-containing monomer, and as needs arise other reforming monomer copolymerizable therewith. A weight average molecular weight of the functional group-containing (meth)acrylic polymer is usually substantially from 200,000 to 2,000,000.

The functional group-containing monomer can be, for instance, carboxyl group-containing monomers such as acrylic acid, methacrylic acid and so on; hydroxyl group-containing monomers such as acrylic acid hydroxyethyl, methacrylic acid hydroxyethyl and so on; epoxy group-containing monomers such as acrylic acid glycidyl, methacrylic acid glycidyl and so on; isocyanate group-containing monomers such as acrylic acid isocyanateethyl, methacrylic acid isocyanateethyl and so on; and amino group-containing monomers such as acrylic acid aminoethyl, methacrylic acid aminoethyl and so on.

As the copolymerizable other reforming monomers, various kinds of monomers can be used that are used in the general (meth)acrylic polymers such as vinyl acetate, acrylonitrile, styrene and so on.

As the functional group-containing unsaturated compounds that are reacted with the functional group-containing (meth)acrylic polymers, ones similar to the functional group-containing monomers mentioned above can be used in accordance with the functional groups of the functional group-containing (meth)acrylic polymers. For instance, in the case of the functional group of the functional group-containing (meth)acrylic polymer being a carboxyl group, an epoxy group-containing monomer or an isocyanate group-containing monomer is used; in the case of the functional group being a hydroxyl group, an isocyanate group-containing monomer is used; in the case of the functional group being an epoxy group, a carboxyl group-containing monomer or an amide group-containing monomer such as acryl amide and so on is used; and in the case of the functional group being an amino group, an epoxy group-containing monomer is used.

As the polyfunctional oligomers or monomers, ones having a molecular weight of 10,000 or less are preferable, and ones having a molecular weight of 5000 or less and are 2 at the minimum and 20 at the maximum in the number of the radical polymerizing unsaturated bonds in the molecule are more preferable, in order that the three-dimensional networking of the adhesive layer due to heating or light irradiation may be effectively formed. The more preferable polyfunctional oligomers or monomers like this are, for instance, trimethylolpropane triacrylate, tetramethylolmethane tetraacrylate, penta-erythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate, commercially available oligoester acrylate or methacrylates similar to the above. These polyfunctional oligomers or monomers may be used singly or in combinations of two or more kinds.

The photo-polymerization initiators, for instance, are ones that can be activated by the irradiation of light having a wavelength in the range of from 250 to 800 nm. The photo-polymerization initiators like this can be, for instance, acetophenone derivatives such as methoxyacetophenone and so on; benzoin ether base compounds such as benzoin propyl ether, benzoin isobutyl ether and so on; kethal derivatives such as benzil dimethyl ketal, acetophenone diethyl ketal and so on; phosphine oxide derivatives; and photo-radical polymerization initiators such as bis(η5-cyclopentadienyl) titanocene derivatives, benzophenone, Michler's ketone, chlorothioxanthone, dodecylthioxanthone, dimethylthioxantone, diethylthioxantone, α-hydroxycyclo-hexyl phenyl ketone, 2-hydroxymethyl phenyl propane and so on. These photo-polymerization initiators may be used singly or in combinations of two or more kinds.

The thermal polymerization initiators can be ones that are decomposed due to heat and generate an active radical that initiates polymerization and hardening. Specifically, these can be for instance, dicumyl peroxide, di-t-butyl peroxide, t-butyl peroxybenzoate, t-butyl hydroperoxide, benzoyl peroxide, cumen hydroperoxide, diisopropylbenzene hydroperoxide, paramenthane hydroperoxide, di-t-butyl peroxide and so on. Among these, in view of high thermal decomposition temperature, cumen hydro peroxide, paramenthane hydroperoxide, di-t-butyl peroxide and so on are preferable. Among these thermal polymerization initiators, ones that are commercially available, though not particularly restricted, for instance, Perbutyl D, Perbutyl H, Perbutyl P and Permentha H (all manufactured by NOF Corporation) and so on can be preferably used. These thermal polymerization initiators may be used singly or in combinations of two or more kinds.

To the above curing type adhesives, other than the above components, with an intention of adjusting the cohesive force as the adhesive, as needs arise, various kinds of polyfunctional compounds that are compounded to general adhesives such as isocyanate compounds, melamine compounds, epoxy compounds and so on may be appropriately blended. Furthermore, known additives such as a plasticizer, resin, surfactant, wax, fine particle filler and so on may be blended.

The adhesives constituting the adhesive layer 15 shown in FIG. 4 and the adhesive layer 18 shown in FIG. 5 are stuck to the substrate 13, as shown in FIG. 2, and does not necessarily have the property that the adherence becomes lower owing to the stimulation. However, when there is necessity of peeling the adhesive sheet 12 off the support plate 13, as explained above, the adhesive layers 15 and 18 are preferably constituted of an adhesive of which adherence is lowered by some kind of stimulation.

The support plate 13 shown in FIG. 2 is made of a hard member such as glass, metal, hard resin and so on, that is high in rigidity and can stably support the adhered semiconductor wafer W without bending. For instance, if the support plate 13 is glass, sufficient rigidity can be obtained when the thickness is in the range of substantially from 0.5 to 2.5 mm. Furthermore, if the stimulation is light as explained above, light can be allowed to go through when the support plate 13 is constituted of a transparent or translucent member. A front face of the glass is preferably smooth so that a flat face may be obtained on grinding.

Figure 7:
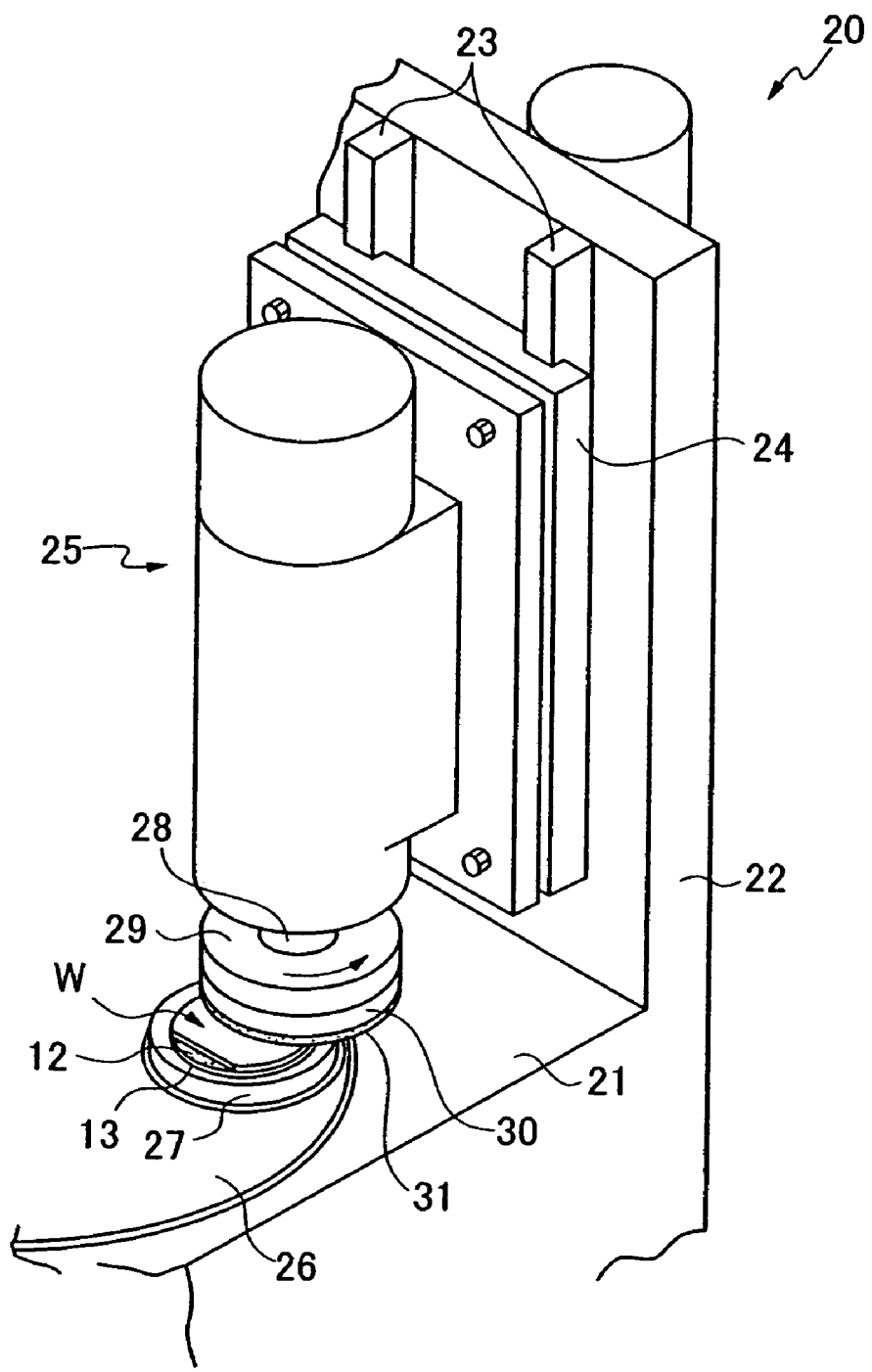
FIG. 7 is a perspective view showing an example of a grinding machine that is used in performing a grinding, step according to the invention.

A rear face of the semiconductor wafer W stuck through the adhesive sheet 12 and integrated with the support plate 13 is ground by use of a grinding machine 20, for instance, as shown in FIG. 7.

In the grinding machine 20, a wall portion 22 is disposed so as to be erected from an end portion of a base table 21, a pair of rails 23 is disposed in a vertical direction on an inside face of the wall portion 22, and as a support portion 24 slides up and down along the rails 23, grinding means 25 attached to the support portion 24 moves up and down. Furthermore, the base table 21 is provided with a rotatable turntable 26. Also, the turntable 26 is provided with a plurality of rotatable chuck tables 27 to hold the semiconductor wafer.

In the grinding means 25, a mounter 29 is fitted at a tip end of a spindle 28 having a shaft center in a vertical direction, a grinding wheel 30 is mounted thereunder, and a grindstone 31 is fixed under the grinding wheel 30, and therefore, as the spindle 28 rotates the grindstone 31 rotates.

In grinding the semiconductor wafer W by use of the grinding machine 20, the semiconductor wafer W integrated with the support plate 13 is held by the chuck table 27 with the support plate 13 directed downward and positioned immediately below the grinding means 25. That is, a rear face 10 of the semiconductor wafer W faces the grindstone 31.

Then, when the spindle 28 is rotated and the grinding means 25 is lowered, the grinding wheel 30 rotates with the rotation of the spindle 28, and the rotating grindstone 31 comes into contact with the semiconductor wafer W to apply a pressing force thereon, and thereby the rear face 10 is ground by the grindstone 31 to have a desired thickness (grinding step).

Figure 8:
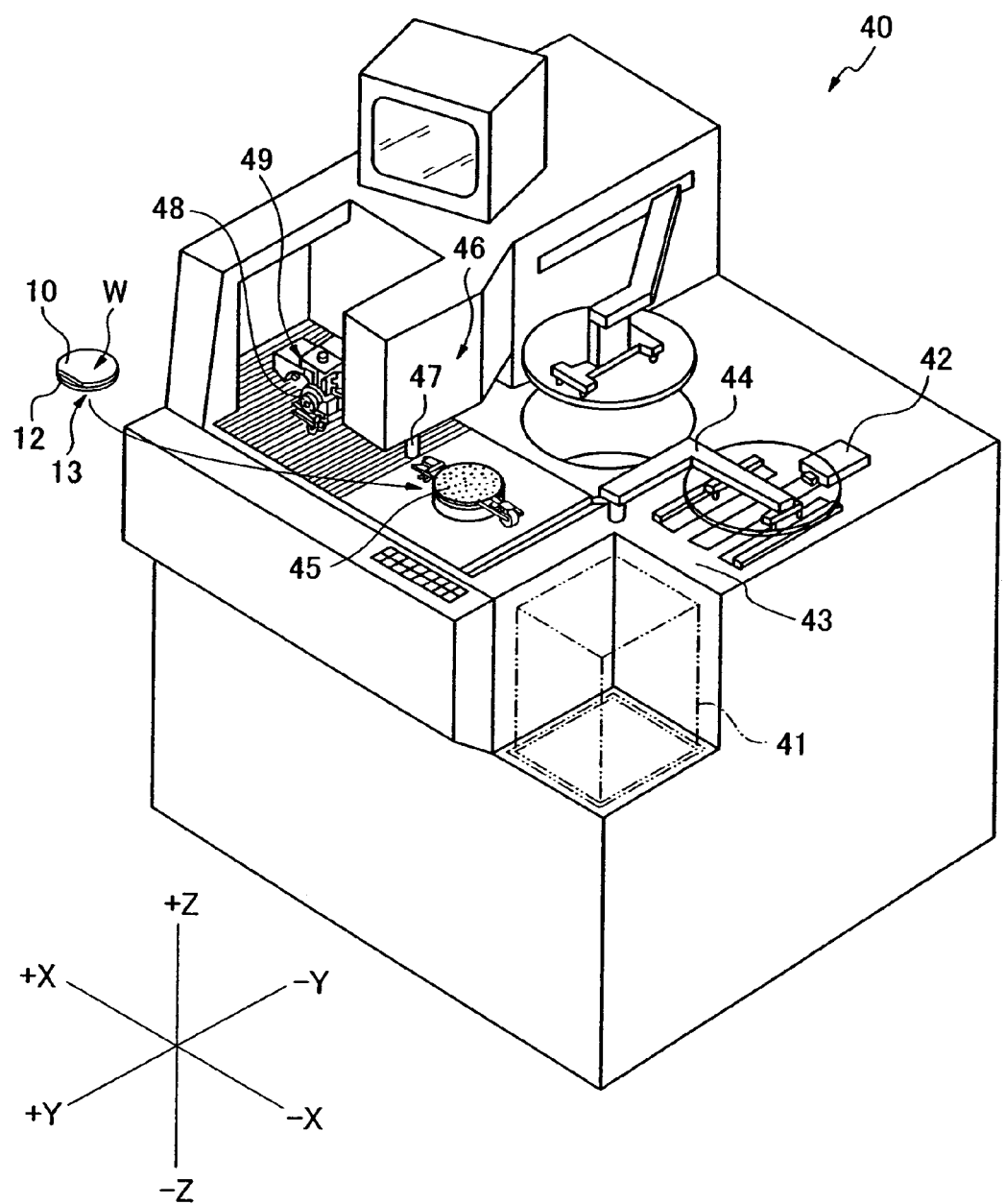
FIG. 8 is a perspective view showing an example of a dicing machine that is used in performing a dicing step according to the invention.

Subsequently, the semiconductor wafer W, having undergone the grinding step and having been formed into a desired thickness, is subjected to dicing, for instance, by use of a dicing machine 40 as shown in FIG. 8.

In the dicing machine 40, the ground semiconductor wafer W is transferred in a state integrated with the support plate 13, that is, with the rear face 10 of the semiconductor wafer W directed upward, and a plurality of semiconductor wafers is housed in a cassette 41.

The semiconductor wafer W integrated with the support plate 13 is transferred out of the cassette 41 by a transferring-in-and-out means 42, then placed on a temporary storage region 43, and thereafter absorbed by first transfer means 44 and transferred to a chuck table 45 by a swing movement thereof, placed thereon with the support plate 13 directed downward (with the rear face of the semiconductor wafer W directed upward) and absorbed and held.

Subsequently, the chuck table 45 holding the semiconductor wafer W moves in a +X direction and thereby is positioned immediately below alignment means 46. The alignment means 46 is provided with an infrared camera 47 that allows light from the rear face 10 of the semiconductor wafer W to transmit and can detect the streets on the front face thereof. The alignment means 46, while moving in a Y direction, allows the infrared camera 47 to transmit an image of the rear face 10 of the semiconductor wafer W held by the support plate 13 and to take an image of the front face, performs the pattern matching processing between a key pattern image previously stored in a memory or the like and a taken image, and thereby detects streets to be cut.

Cutting means 49 provided with a rotating blade 48 are formed integrated with the alignment means 46. Furthermore, the rotating blade 48 is the same in a Y-axis as that of the infrared camera 47. That is, both are located on a straight line in an X-axis direction.

Accordingly, when a street is detected by the alignment means 46, the street and the rotating blade 48 are automatically aligned in the Y-axis direction. The chuck table 45 holding the semiconductor wafer W supported by the support plate 13 moves further in the +X direction, the cutting means 49 descends with the rotating blade 48 rotating at a high speed and cuts in the detected street from a side of the rear face 10, and thereby the street is cut.

Figure 9:
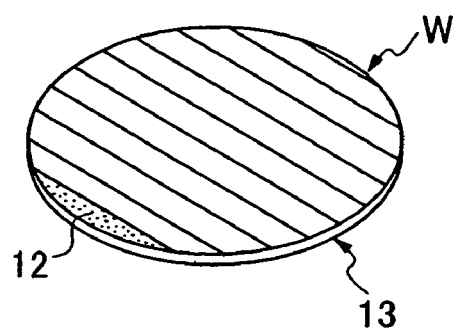
FIG. 9 is a perspective view showing a state where all streets in one direction are cut in the step of dicing.

When the chuck table 45 is reciprocated in the X-axis direction and the cutting means 49 is index-fed by a street separation in the Y-axis direction, all streets in the same direction can be cut as shown in FIG. 9.

Figure 10:
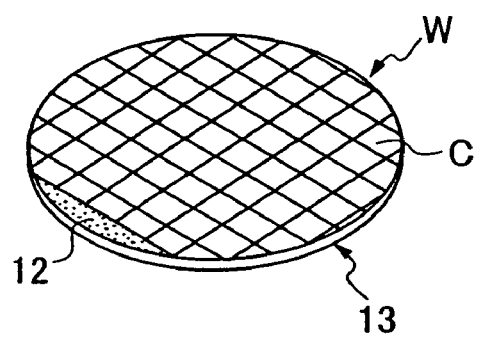
FIG. 10 is a perspective view showing a state where the streets are cut vertically and horizontally in the step of dicing.

Furthermore, when the chuck table 45 is rotated by 90 degree and the cutting is carried out similarly to the above, all the streets are cut and diced and thereby the semiconductor wafer is divided into individual semiconductor chips as shown in FIG. 10 (dicing step).

Even after the wafer is thus diced, the individual semiconductor chips C are still stuck to the support plate 13, and accordingly it is necessary to peel the semiconductor chips C off the support plate 13 and pick them up.

A number of semiconductor chips C and the support plate 13 are in one body owing to the adhesive sheet 12 shown in FIG. 2; and accordingly, the semiconductor chips C are made easily peelable by applying the stimulation to the adhesive sheet 12 to lower the adherence of the adhesive sheet 12.

Figure 11:
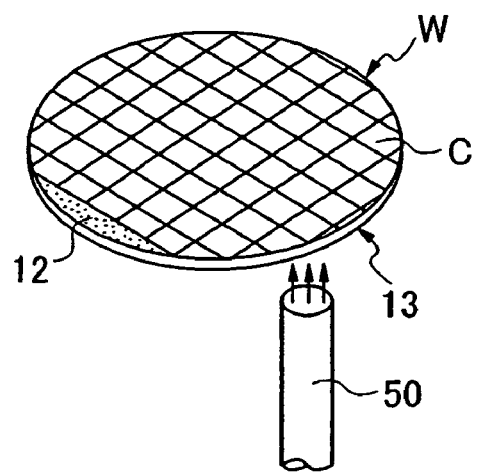
FIG. 11 is a perspective view showing a separation step according to the invention.

In the case of the gas-generating agent that generates a gas due to, for instance, UV light being contained in the adhesive sheet 12, UV light is irradiated from a irradiation portion 50 below the support plate 13 to generate a gas as shown in FIG. 11, thereby a gas is generated between the semiconductor chips C, and accordingly the adherence can be lowered.

At this time, the UV light can be irradiated to the whole adhesive sheet 12. However, when the adherence of the whole sheet 12 is lowered, there is a likelihood that the semiconductor chips C will become detached and fall before they are picked up. Accordingly, as shown in FIG. 11, it is preferable to irradiate UV light only on a semiconductor chip that will be immediately picked up. The semiconductor chips stuck to portions where adherence is lowered can be easily separated from the support plate 13 (separation step).

Furthermore, the whole adhesive sheet 12 may be exposed to UV light to reduce the adherence to a certain degree and thereafter irradiating UV light to portions to be separated immediately before they are separated. Partial heating may be applied to peel chip by chip.

Figure 12:
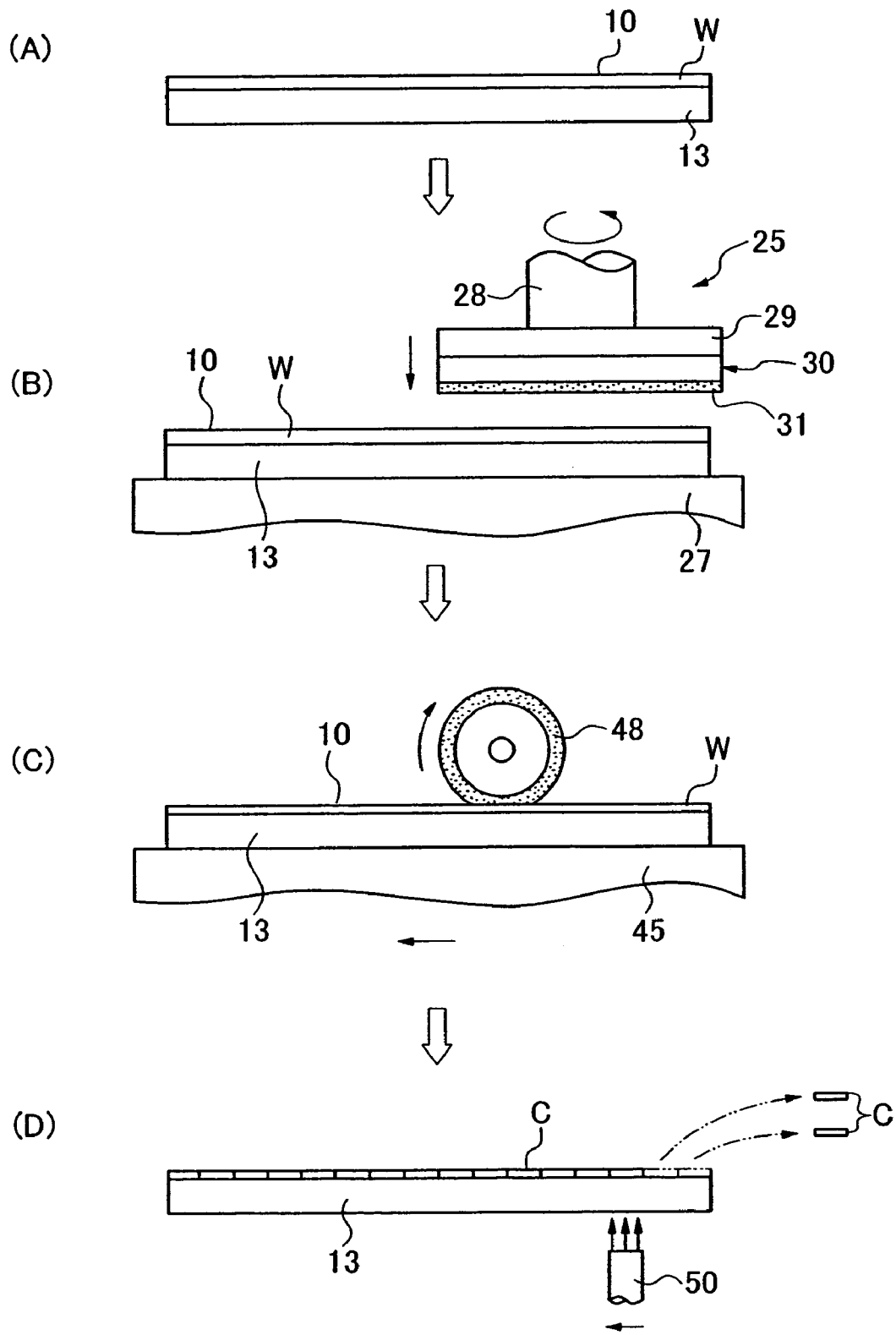
FIG. 12 is an explanatory diagram showing the invention with individual steps.

The above-mentioned method of dividing the semiconductor wafer can be illustrated with the individual steps (A) through (D) in FIG. 12. Firstly, in the step of integrating the support plate (A), the semiconductor wafer W is stuck to the support plate 13 so that the rear face 10 may be directed upward and held in this state by the chuck table 27 of the grinding machine, and the rear face thereof is ground by the grindstone 31 in the grinding step (B).

Then, in the dicing step (C), the semiconductor wafer W is held by the chuck table 45 of the dicing machine in the state being stuck to the support plate 13, and the semiconductor wafer W is diced. Finally, the individual semiconductor chips formed by the dicing are picked up in the separation step (D) and removed from the support plate 13.

Since the semiconductor chips C thus manufactured are supported by the support plate 13 which is high in rigidity during all of the respective steps of grinding, dicing and transferring from the grinding to the dicing, the semiconductor chips do not undergo cracking, chipping, deformation and so on. Accordingly, finally manufactured semiconductor chips are high in quality and the yield is also improved.

In particular, even in the case of a semiconductor wafer having, for instance, a thickness of 50 µm or less where many of the semiconductor wafers usually undergo damage, deformation and so on in the course of manufacture, high-quality semiconductor chips can be manufactured without damage.

Figure 13:
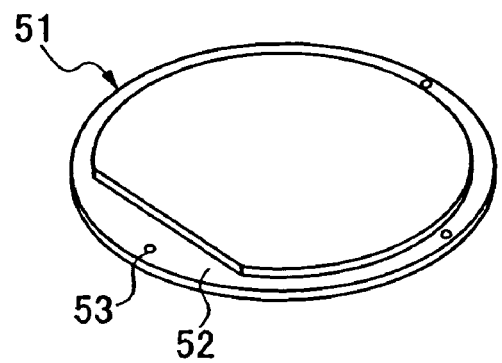
FIG. 13 is a perspective view showing a second example of a support plate.
Figure 14:
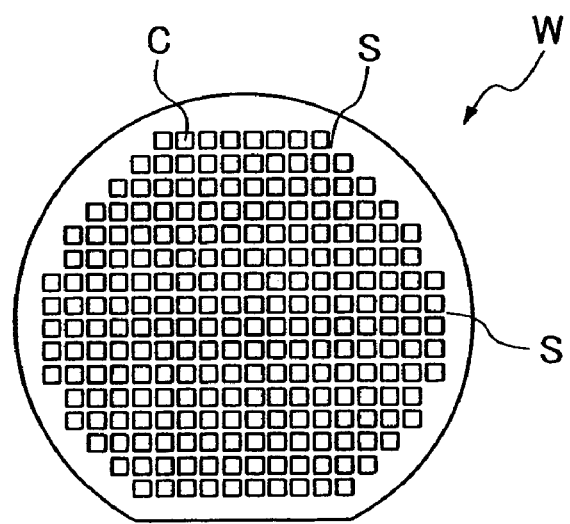
FIG. 14 is a plan view showing a semiconductor wafer.

In the above mode, infrared light is used to apply alignment in the dicing machine 40; however, when a support plate 51 is made larger than a semiconductor wafer W and alignment marks 53 indicating positions of streets are formed in advance on an exposed outer periphery portion 52, as shown in FIG. 13, streets to be cut can be detected to perform alignment by imaging the alignment marks 53 according to an ordinary imaging method without relying on the infrared camera.

INDUSTRIAL APPLICABILITY

As mentioned above, according to the method for manufacturing semiconductor chips according to the invention, the semiconductor wafer is stuck to the highly-rigid support plate through the adhesive sheet for which adherence decreases due to the stimulation, grinding and dicing are applied in this state, and afterward the stimulation is applied to lower the adherence, and the semiconductor chips can be picked up. As a result, in these steps or during transportation between these steps, the semiconductor wafer or semiconductor chips can always be stably supported and the semiconductor chips can be safely, assuredly and easily picked up. Accordingly, the present manufacturing method is useful in manufacturing semiconductor chips having no damage such as cracking and chipping, deformation and so on and are high in quality and yield. In particular, the present invention is extremely useful because even in the case of manufacturing semiconductor chips that are extremely thin in thickness such as 50 µm or less, a similar effect can be obtained.

The invention claimed is:

1. A method for manufacturing semiconductor chips by dividing a semiconductor wafer, on which a circuit is formed in each of plural regions divided by streets, into semiconductor chips for individual circuits, said method comprising:
   integrating a support plate with a semiconductor wafer by sticking a front face of the semiconductor wafer to the support plate via an adhesive sheet that includes a gas-generating agent which, upon stimulation, generates a gas to lower an adherence of the adhesive sheet;
   grinding a rear face of the semiconductor wafer integrated with the support plate;
   dicing the semiconductor wafer, ground and integrated with the support plate, from the rear face of the semiconductor wafer into semiconductor chips; and
   separating the semiconductor chips from the support plate by applying stimulation to cause generation of gas by the gas-generating agent to lower the adherence of the adhesive sheet.

2. A method for manufacturing semiconductor chips according to claim 1, wherein the adhesive sheet includes the gas-generating agent only in a surface layer portion thereof that is put in contact with the semiconductor wafer when the front face of the semiconductor wafer is stuck to the support plate, such that the gas-generating agent is not dispersed throughout the adhesive sheet.

3. A method for manufacturing semiconductor chips according to claim 2, wherein the stimulation is UV light and the gas-generating agent generates a gas due to the UV light.

4. A method for manufacturing semiconductor chips according to claim 3, wherein in the separating step, only a semiconductor chip that is to be separated from the support plate is irradiated by UV light.

5. A method for manufacturing semiconductor chips according to claim 3, wherein the gas-generating agent included in the adhesive sheet is made of an azo compound in at least one or more kinds of resins selected from an acrylic, olefinic and polycarbonate base resin.

6. A method for manufacturing semiconductor chips according to claim 3, wherein the support plate is made of a transparent or translucent material.

7. A method for manufacturing semiconductor chips according to claim 3, wherein alignment marks indicating positions of streets are formed on an outer periphery portion of the support plate.

8. A method for manufacturing semiconductor chips according to claim 1, wherein the stimulation is UV light and the gas-generating agent generates a gas due to the UV light.

9. A method for manufacturing semiconductor chips according to claim 8, wherein in the separating step, only a semiconductor chip that is to be separated from the support plate is irradiated by UV light.

10. A method for manufacturing semiconductor chips according to claim 8, wherein the gas-generating agent included in the adhesive sheet is made of an azo compound in at least one or more kinds of resins selected from an acrylic, olefinic and polycarbonate base resin.

11. A method for manufacturing semiconductor chips according to claim 10, wherein the support plate is made of a transparent or translucent material.

12. A method for manufacturing semiconductor chips according to claim 8, wherein alignment marks indicating positions of streets are formed on an outer periphery portion of the support plate.

13. A method for manufacturing semiconductor chips according to claim 8, wherein the support plate is made of a transparent or translucent material.

14. A method for manufacturing semiconductor chips according to claim 1, wherein the support plate is made of a transparent or translucent material.

15. A method for manufacturing semiconductor chips according to claim 14, wherein the support plate is made of glass and a thickness thereof is in the range of from 0.5 to 2.5 mm.

16. A method for manufacturing semiconductor chips according to claim 1, wherein alignment marks indicating positions of streets are formed on an outer periphery portion of the support plate.

* * * * *